(12) United States Patent
Yoshida

(10) Patent No.: US 8,395,439 B2
(45) Date of Patent: Mar. 12, 2013

(54) SEMICONDUCTOR DEVICE HAVING FUSE CIRCUIT AND CONTROL METHOD THEREOF

(75) Inventor: Kenji Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 190 days.

(21) Appl. No.: 12/923,166

(22) Filed: Sep. 7, 2010

(65) Prior Publication Data

US 2011/0057719 A1 Mar. 10, 2011

(30) Foreign Application Priority Data

Sep. 8, 2009 (JP) .................................. 2009-207184

(51) Int. Cl.
*G05F 1/10* (2006.01)
(52) U.S. Cl. ......................... 327/538; 327/534; 327/525
(58) Field of Classification Search .................... 327/525
See application file for complete search history.

(56) References Cited

U.S. PATENT DOCUMENTS

| | | | | |
|---|---|---|---|---|
| 5,671,149 | A * | 9/1997 | Brown ............................. | 702/64 |
| 5,909,142 | A * | 6/1999 | Kawasaki et al. ............. | 327/543 |
| 6,177,785 | B1 * | 1/2001 | Lee ................................ | 323/281 |
| 6,598,212 | B2 | 7/2003 | Okayasu | |
| 6,943,616 | B2 * | 9/2005 | Ogawa et al. ................. | 327/538 |
| 6,969,981 | B1 * | 11/2005 | Fairbanks et al. ............. | 323/299 |
| 7,274,247 | B2 * | 9/2007 | Ward et al. .................... | 327/534 |
| 7,277,350 | B2 * | 10/2007 | Huckaby et al. .............. | 365/226 |
| 7,453,311 | B1 * | 11/2008 | Hart et al. ..................... | 327/534 |
| 7,501,883 | B2 * | 3/2009 | Cho ............................... | 327/540 |
| 7,514,953 | B2 * | 4/2009 | Perisetty ......................... | 326/27 |
| 8,208,317 | B2 * | 6/2012 | Kang et al. ............... | 365/189.09 |
| 2006/0259840 | A1 * | 11/2006 | Abadeer et al. ............... | 714/733 |
| 2008/0048672 | A1 * | 2/2008 | Yamaguchi ................... | 324/550 |
| 2008/0080264 | A1 * | 4/2008 | Chi ........................ | 365/189.09 |
| 2008/0253042 | A1 * | 10/2008 | Arsovski ........................ | 361/56 |
| 2009/0021985 | A1 * | 1/2009 | Byeon ..................... | 365/185.18 |
| 2009/0040804 | A1 * | 2/2009 | Mori et al. ...................... | 365/96 |
| 2010/0090750 | A1 * | 4/2010 | Kim ............................... | 327/525 |

FOREIGN PATENT DOCUMENTS

JP 2002-76855 3/2002

* cited by examiner

*Primary Examiner* — Thomas J Hiltunen
(74) *Attorney, Agent, or Firm* — McGinn IP Law Group, PLLC

(57) ABSTRACT

An internal voltage adjusting circuit of a semiconductor memory device processes a period from activation to deactivation of a reset bar signal by dividing the period into a first period to a third period. In the first period, a peripheral circuit voltage is stabilized to a lowest value to suppress power consumption. In the second period in which a power source voltage is stabilized, the peripheral circuit voltage is set to a highest value to read out optimum internal voltage values from a fuse circuit in a stable manner. In the third period after reading out the optimum internal voltage values, the peripheral circuit voltage is returned to the lowest value to suppress the power consumption. When the reset bar signal is deactivated, the peripheral circuit voltage is set based on the optimum internal voltage values read out from the fuse circuit.

16 Claims, 5 Drawing Sheets

SEMICONDUCTOR DEVICE HAVING FUSE CIRCUIT AND CONTROL METHOD THEREOF

BACKGROUND OF THE INVENTION

1. Field of the Invention

The present invention relates to a semiconductor device and a control method thereof, and particularly to a control method at the time of activating a semiconductor device.

2. Description of Related Art

A demand for a semiconductor memory device such as a DRAM (Dynamic Random Access memory) to increase operation speed and degree of integration and to reduce power consumption has been met mainly with a development of the micro-fabrication technology. However, as the operation voltage decreases with downscaling of circuits, a fluctuation of threshold voltage and an off-state leak current (a consumption current at standby) due to the short channel effect become more problematic. Therefore, a process for measuring the threshold voltage and the like of a transistor and optimizing internal voltages for each semiconductor memory device has become essential.

To set optimum internal voltages for each semiconductor memory device, it is necessary to store optimum values in the semiconductor memory device. A fuse element is often used as a memory element for storing the values. The fuse element is electrically in a conductive state in an initial state, and is changed to a nonconductive state (an insulation state) with line-breaking by an irradiation with a laser beam. Information of one bit can be represented by the conductive state and the nonconductive state of one fuse element.

In recent years, an antifuse element is used instead of the fuse element in many cases. The antifuse element is in a nonconductive state in an initial state, and is changed to a conductive state with an insulation-breakdown by an application of a high voltage. Japanese Patent Application Laid-open No. 2002-76855 discloses a technology for adjusting internal voltages by using an antifuse element.

Because the antifuse element is smaller than the fuse element in size and there is no damage on a passivation layer due to programming, it is expected to be in widespread use in the future.

However, even after the insulation breakdown, a resistance of the antifuse element is relatively large. The resistance of the antifuse element in the "conductive state" is hundreds of times as large as the resistance of the fuse element in the "conductive state". Therefore, the antifuse element requires more time to read out data than the fuse element. In addition, a circuit for reading out data from the antifuse element, if not supplied with a sufficient internal voltage, cannot read out data in a stable manner. Because the voltage is not stabilized right after activation, there is a problem that it is hard to read out data in a stable manner.

SUMMARY

In one embodiment, there is provided a semiconductor device that includes a fuse circuit that holds a first value as a parameter for a control target circuit and a control circuit that sets the first value in the control target circuit. The control circuit sets a second value that is different from the first value as the parameter for the control target value at the time of activation.

According to the present invention, it is possible to stabilize an operation of a semiconductor device at the time of power on activation.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
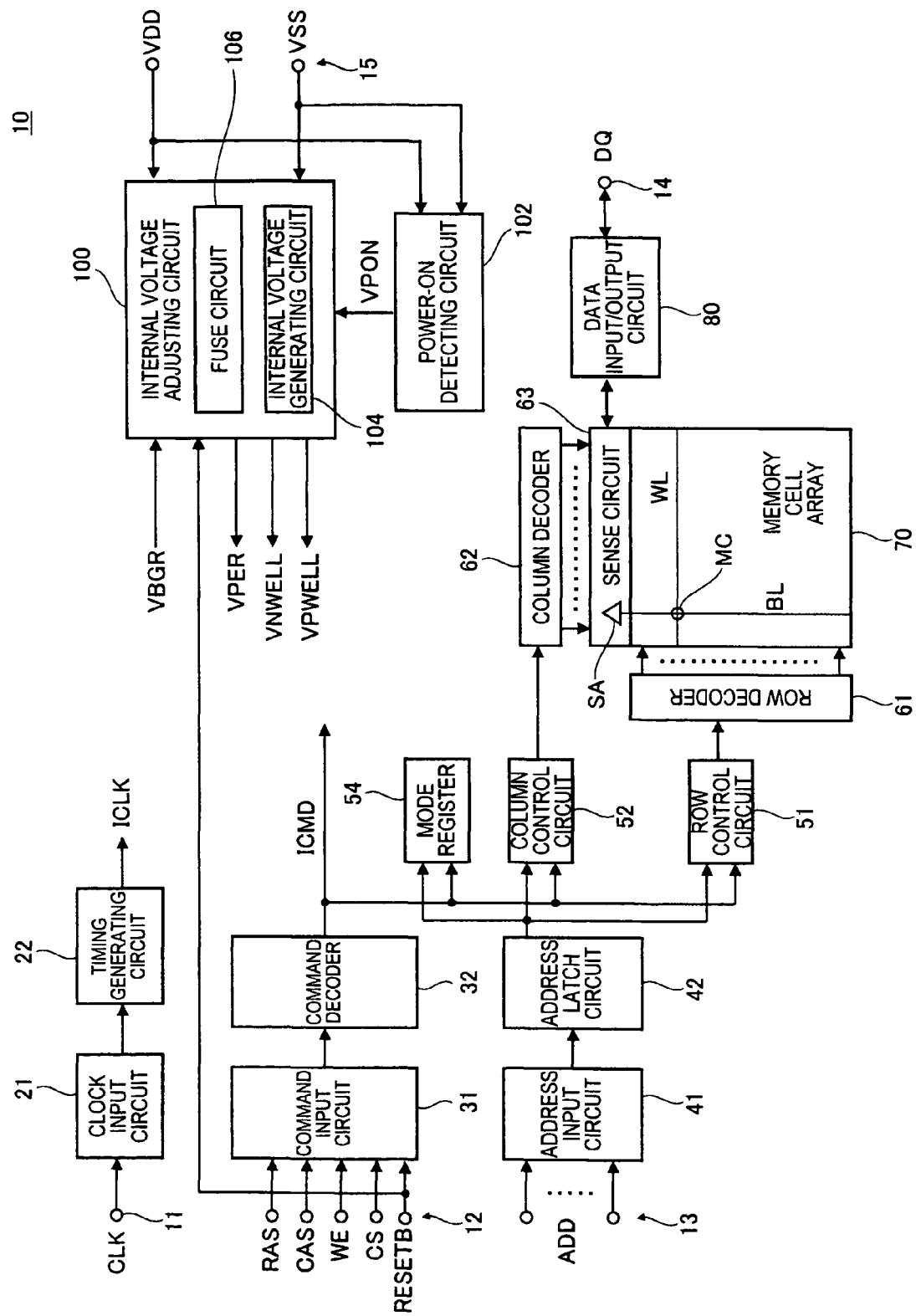
FIG. 1 is a functional block diagram of a semiconductor memory device.

FIG. 1 is a functional block diagram of a semiconductor memory device 10. The semiconductor memory device 10 according to the present embodiment is a DDR (Double-Data-Rate) SDRAM (Synchronous Dynamic Random Access Memory), including external terminals such as a clock terminal 11, a command terminal 12, an address terminal 13, a data input/output terminal 14, and a power source terminal 15. Although not shown in FIG. 1, the semiconductor memory device 10 further includes a data strobe terminal, a calibration terminal and the like.

The clock terminal 11 is a terminal to which a clock signal CLK is supplied. The clock signal CLK is then supplied to a clock input circuit 21. An output of the clock input circuit 21 is supplied to a timing generating circuit 22. The timing generating circuit 22 generates an internal clock ICLK and supplies it to various internal circuits described later.

The command terminal 12 includes a plurality of terminals to which command signals including a row address strobe signal RAS, a column address strobe signal CAS, a write enable signal WE, a chip select signal CS, a reset bar signal RESETB (hereinafter, simply "RESETB") and the like are respectively supplied. These command signals are supplied to a command input circuit 31. The command signals supplied to the command input circuit 31 are then supplied to a command decoder 32. The command decoder 32 generates various internal commands ICMD by holding, decoding, and counting the command signals in synchronization with the internal clock ICLK. The generated internal commands ICMD are supplied to a row control circuit 51, a column control circuit 52, a mode register 54 and the like.

The mode register 54 sets an operation mode of the semiconductor memory device 10. For example, a latency or a clock frequency at the time of a normal operation is defined by a mode signal set in the mode register 54. In addition, it is also possible to enter a test mode and the like by the mode signal set in the mode register 54.

The address terminal 13 is a terminal to which an address signal ADD is supplied. The address signal ADD is then supplied to an address input circuit 41. An output of the address input circuit 41 is supplied to an address latch circuit 42. The address latch circuit 42 latches the address signal ADD in synchronization with the internal clock ICLK. Among the latched address signal ADD, a row address is supplied to the row control circuit 51, and a column address is supplied to the column control circuit 52. In addition, when a mode register set is activated, the address signal ADD is supplied to the mode register 54.

An output of the row control circuit 51 is supplied to a row decoder 61. The row decoder 61 selects any one of a plurality of word lines WL included in a memory cell array 70. In the memory cell array 70, a plurality of word lines WL and a plurality of bit lines BL intersect with each other, and a memory cell MC is arranged at every intersection of the word lines WL with the bit lines BL (however, only one word line WL, one bit line BL, and one memory cell MC are shown in FIG. 1). Each of the bit lines BL is connected to its corresponding sense amplifier SA included in a sense circuit 63. An output of the column control circuit 52 is supplied to a column decoder 62. The column decoder 62 selects any one of the bit lines BL included in the memory cell array 70.

The column decoder 62 selects any one of the sense amplifiers SA included in the sense circuit 63, that is, a bit line BL to be subject to a data access, based on the column address from the address signal ADD. The sense amplifier SA selected by the column decoder 62 is connected to a data input/output circuit 80. With this configuration, the memory cell MC that is an access target is connected to the data input/output terminal 14 via the data input/output circuit 80. The data input/output terminal 14 is a terminal for performing an output of read data DQ and an input of write data DQ.

Each of the circuits included in the semiconductor memory device 10 is driven by a peripheral circuit voltage VPER, an N-well bias voltage VNWELL, a P-well bias voltage VPWELL, or an external voltage VDD. The peripheral circuit voltage VPER is generated by a voltage step down of the external voltage VDD, and therefore the peripheral circuit voltage VPER is lower than the external voltage VDD. The internal voltages such as the peripheral circuit voltage VPER, the N-well bias voltage VNWELL, and the P-well bias voltage VPWELL are set to optimum values for each semiconductor memory device 10 by a method that is described later.

A power-on detecting circuit 102 detects power activation. The power-on detecting circuit 102 is connected to the power source terminal 15 that includes two power source terminals. The external voltage VDD and a substrate voltage VSS are supplied to the power-on detecting circuit 102 from the two power source terminals, respectively. Upon being supplied with the external voltage VDD, the power-on detecting circuit 102 inputs a power-on detection signal VPON to an internal voltage adjusting circuit 100.

The external voltage VDD, the substrate voltage VSS, and a reference voltage VBGR are supplied to the internal voltage adjusting circuit 100. The internal voltage adjusting circuit 100 includes a fuse circuit 106 that holds optimum internal voltage values (hereinafter, "AF values") and an internal voltage generating circuit 104 that generates the internal voltages based on the AF values. When the power-on detection signal VPON is input, the internal voltage adjusting circuit 100 reads out the AF values from the fuse circuit 106. A configuration of the internal voltage adjusting circuit 100 is explained below in detail with reference to FIG. 2.

The RESETB is also input to the internal voltage adjusting circuit 100. The RESETB is a signal that is deactivated in a predetermined time after the power is turned on. When the RESETB is deactivated, the internal voltage adjusting circuit 100 adjusts the peripheral circuit voltage VPER, the N-well bias voltage VNWELL, and the P-well bias voltage VPWELL based on the AF values read out from the fuse circuit 106.

An overall configuration of the semiconductor memory device 10 according to the present embodiment is as described above. Explanations are given below mainly with a control of the peripheral circuit voltage VPER and the N-well bias voltage VNWELL by the internal voltage adjusting circuit 100. A method of controlling the P-well bias voltage VPWELL is basically the same as a method of controlling the N-well bias voltage VNWELL.

Figure 2:
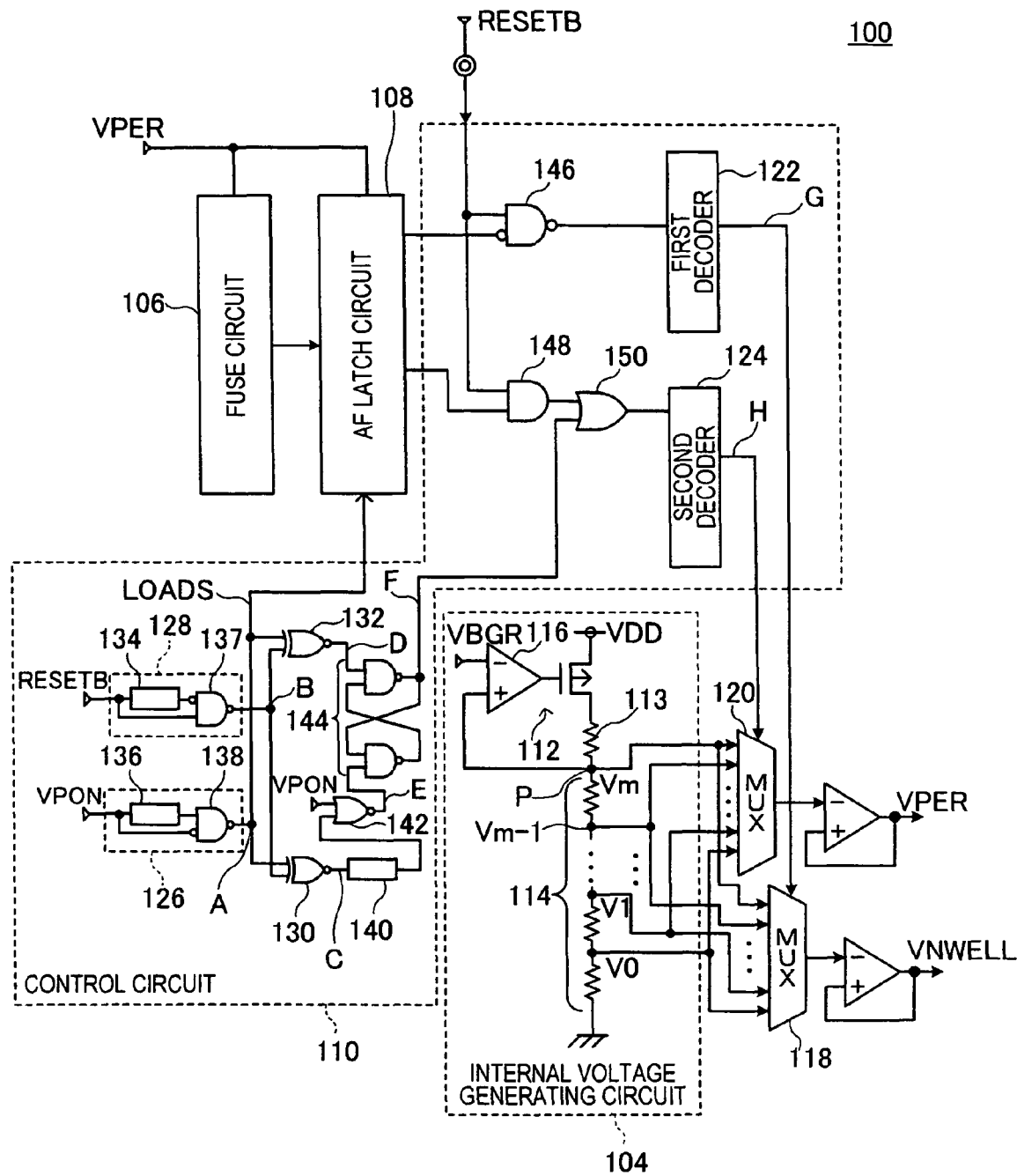
FIG. 2 is a circuit diagram of the internal voltage adjusting circuit.

FIG. 2 is a circuit diagram of the internal voltage adjusting circuit 100. The internal voltage adjusting circuit 100 includes the fuse circuit 106, an AF latch circuit 108, the internal voltage generating circuit 104, and a control circuit 110. The fuse circuit 106 includes a plurality of antifuse elements. The AF values are stored in these antifuse elements in a nonvolatile and irreversible manner. The AF values in the present embodiment are the optimum values for the peripheral circuit voltage VPER, the N-well bias voltage VNWELL, and the P-well bias voltage VPWELL. Each semiconductor memory device 10 has different optimum values.

Upon being asserted with a LOADS signal from the control circuit 110, which is described later, the AF latch circuit 108 latches the AF values from the fuse circuit 106.

The internal voltage generating circuit 104 is configured to generate a plurality of internal voltages. The internal voltage generating circuit 104 includes a circuit composed of a depletion PMOS (Positive channel Metal Oxide Semiconductor) transistor 112 and resistors 113 and 114 connected in series between the external voltage VDD and the ground. A potential at a connection point P between the resistor 113 and the resistors 114 is compared with the reference voltage VBGR by an operational amplifier 116, and an on-resistance of the PMOS transistor 112 is changed according to a result of the comparison. With this operation, the potential at the connection point P is adjusted to coincide with the reference voltage VBGR.

A plurality of intermediate potentials are extracted from the resistors 114 that are inserted between the ground and the connection point P. These intermediate potentials are input to a first multiplexer 118 and a second multiplexer 120. Therefore, intermediate potentials V0 to Vm in a range from 0 volt to the reference voltage VBGR are supplied to each of the first multiplexer 118 and the second multiplexer 120. Among the intermediate potentials V0 to Vm input to the first multiplexer 118, an intermediate potential that is designated by the control circuit 110 becomes the peripheral circuit voltage VPER. Similarly, among the intermediate potentials V0 to Vm input to the second multiplexer 120, an intermediate potential that is designated by the control circuit 110 becomes the N-well bias voltage VNWELL. Although not shown in FIG. 2, the same goes for the P-well bias voltage VPWELL.

The control circuit 110 controls the peripheral circuit voltage VPER, the N-well bias voltage VNWELL and the like by inputting select signals G and H to the first multiplexer 118 and the second multiplexer 120, respectively. The select signals are multivalued decode signals for designating any one of the intermediate potentials V0 to Vm. For example, the lowest value V0 is selected when the select signal is the minimum value, and the highest value Vm is selected when the select signal is the maximum value. The control circuit 110 includes a first decoder 122 that is a selector circuit that selects the peripheral circuit voltage VPER and a second decoder 124 that is a selector circuit that controls the N-well bias voltage VNWELL.

The control circuit 110 is triggered by an input of two signals including the power-on detection signal VPON and the RESETB. The peripheral circuit voltage VPER and the N-well bias voltage VNWELL at the time of a normal operation are determined by the AF values held in the fuse circuit 106. On the other hand, the peripheral circuit voltage VPER and the N-well bias voltage VNWELL right after power-on activation are forcibly set to predetermined values by the control circuit 110.

The power-on detection signal VPON and the RESETB are input to the control circuit 110 as external signals. The power-on detection signal VPON is input to a one-shot pulse circuit 126 and a NOR gate 142. The RESETB is input to a one-shot pulse circuit 128, a NAND gate 146, and an AND gate 148.

The one-shot pulse circuit 126 to which the power-on detection signal VPON is input includes a NAND gate 138 and a first delay circuit 136. A signal A output from the one-shot pulse circuit 126 is normally fixed to the high level, and becomes a low level pulse only when the power-on detection signal VPON is changed from the high level to the low level. The signal A becomes the LOADS signal, and when the signal A (LOADS signal) becomes the low level pulse, the AF latch circuit 108 latches the AF values from the fuse circuit 106.

The one-shot pulse circuit 128 to which the RESETB is input includes a NAND gate 137 and a second delay circuit 134. A signal B output from the one-shot pulse circuit 128 is normally fixed to the high level, and becomes a low level pulse only when the RESETB is deactivated, that is, when the RESETB is changed from the low level to the high level.

The signals A and B are input to both an XOR gate 130 and an XNOR gate 132. A signal C output from the XOR gate 130 is normally fixed to the low level, and becomes a high level pulse only when either the signal A or the signal B becomes the low level pulse. A signal D output from the XNOR gate 132 behaves in an opposite manner to the signal C.

The signal C is input to the NOR gate 142 via a third delay circuit 140. The power-on detection signal VPON and the signal C are input to the NOR gate 142. The length of a second period, which is described later, is determined by a delay time of the third delay circuit 140. Even when the signal C is changed, an output of the NOR gate 142 is not immediately changed because of the third delay circuit 140.

An SR flip-flop 144 takes the signal D and a signal E that is an output of the NOR gate 142 as its input. When the signal D is the high level and the signal E is the low level, a signal F that is an output of the SR flip-flop 144 is reset to the low level, and when the signal D is the low level and the signal E is the high level, the signal F is set to the high level. When both the signal D and the signal E are the high levels, the signal F maintains its current value. The signal D and the signal E never become the low levels at the same time.

The NAND gate 146 is inserted in a path from the AF latch circuit 108 to the first decoder 122. Inputs of the NAND gate 146 are the AF value (for setting the N-well bias voltage VNWELL) read out from the AF latch circuit 108 and the RESETB. When the RESETB becomes the high level (a non-activated state), the AF value latched in the AF latch circuit 108 is transferred to the first decoder 122. An output of the NAND gate 146 is fixed to the high level when the RESETB is the low level (an activated state). The first multiplexer 118 is controlled by the select signal G output from the first decoder 122, by which the N-well bias voltage VNWELL is determined. That is, the N-well bias voltage VNWELL is set to the AF value when the RESETB is the high level, while it is set to the highest value Vm regardless of the AF value when the RESETB is the low level. More details on this point are explained later.

In actual cases, the number of paths from the AF latch circuit 108 to the first decoder 122 equals to the number of bits of the AF value (for setting the N-well bias voltage VNWELL). FIG. 2 representatively shows only one path for ease of explanation.

In a path from the AF latch circuit 108 to the second decoder 124, the AND gate 148 and an OR gate 150 are connected in series. Inputs of the AND gate 148 are the AF value (for setting the peripheral circuit voltage VPER) read out from the AF latch circuit 108 and the RESETB. When the RESETB becomes the high level (the non-activated state), the AF value latched in the AF latch circuit 108 is transferred to the OR gate 150. When the RESETB is the low level (the activated state), an output of the AND gate 148 is fixed to the low level.

Inputs of the OR gate 150 are the output of the AND gate 148 and the signal F. When the RESETB becomes the high level, a logical sum of the AF value and the signal F is transferred to the second decoder 124. When the RESETB is the low level, the OR gate 150 inputs the signal F to the second decoder 124 regardless of the AF value. The second multiplexer 120 is controlled by the select signal H output from the second decoder 124, by which the peripheral circuit voltage VPER is determined. More details on this point are explained later.

In actual cases, the number of paths from the AF latch circuit 108 to the second decoder 124 equals to the number of bits of the AF value (for setting the peripheral circuit voltage VPER). FIG. 2 representatively shows only one path for ease of explanation.

As described above, the fuse circuit 106 and the AF latch circuit 108 are driven based on the peripheral circuit voltage VPER. Right after the power is turned on, because the external voltage VDD for generating the peripheral circuit voltage VPER is not stable, it is not possible to operate the fuse circuit 106 and the AF latch circuit 108 in a stable manner, so that it is not possible to read out the AF values from the fuse circuit 106 in a stable manner. Without reading out the AF values in a proper manner, it is not possible to supply an appropriate peripheral circuit voltage VPER to the fuse circuit 106 and the like. Therefore, in order to set the AF value to the peripheral circuit voltage VPER, a mechanism to lead the fuse circuit 106 and the AF latch circuit 108 to stable operations is required at an initial state right after the power is turned on. The control circuit 110 leads the internal voltage adjusting circuit 100 to the stable operations by forcibly setting predetermined values other than the AF values to the peripheral circuit voltage VPER and the like right after the power is turned on.

Figure 3:
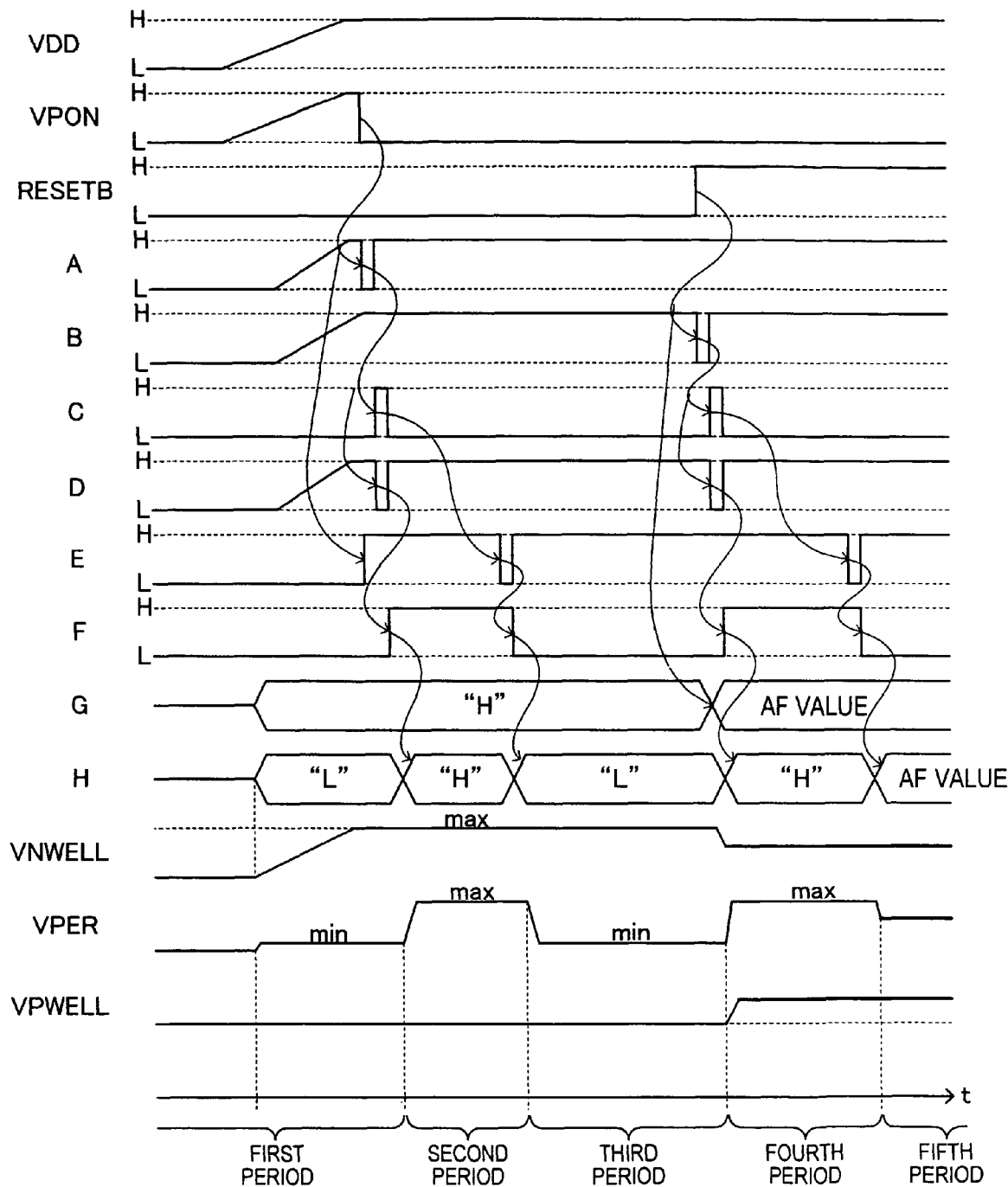
FIG. 3 is a timing chart showing an operation of the internal voltage adjusting circuit after power-on activation according to the present embodiment.

FIG. 3 is a timing chart showing an operation of the internal voltage adjusting circuit 100 after power-on activation according to the present embodiment. When the power is turned on, the external voltage VDD supplied to the semiconductor memory device 10 rises gradually. In response to a rise of the external voltage VDD, the power-on detecting circuit 102 causes the power-on detection signal VPON to rise. The power-on detection signal VPON rises in conjunction with the external voltage VDD as shown in FIG. 3, and is changed to the low level in response to the external voltage VDD having reached a predetermined value. When the power is supplied to the semiconductor memory device 10, the internal voltage adjusting circuit 100 starts an operation as follows.

In the semiconductor memory device 10, the RESETB is maintained to the low level (the activated state) until a predetermined time elapses after the power is turned on, and it is deactivated to the high level in a predetermined time. For example, the RESETB is changed to the high level in 200 microseconds after the power is turned on.

A period from power-on activation until the RESETB is deactivated is explained below by dividing the period into a first period to a third period. The first period is a period for waiting a stabilization of the external voltage VDD supplied to the semiconductor memory device 10, the second period is a period for the AF latch circuit 108 to latch the AF values from the fuse circuit 106, and the third period is a period for waiting deactivation of the RESETB.

Furthermore, a period after the RESETB is deactivated is explained by dividing the period into a fourth period and a fifth period. The fourth period is a period for setting the AF values to the N-well bias voltage VNWELL and the P-well bias voltage VPWELL, and the fifth period is a period for setting the AF value to the peripheral circuit voltage VPER.

(1) First Period

When the power turned on, the signals A and B output from the one-shot pulse circuits 126 and 128 rise to the high level in conjunction with the rise of the external voltage VDD. When both the signals A and B are the high levels, the signal C output from the XOR gate 130 is the low level, and the signal D output from the XNOR gate 132 is the high level. Because the power-on detection signal VPON is input to the NOR gate 142, the signal E becomes the low level. Because the SR flip-flop 144 is reset when the signal D is the high level and the signal E is the low level, the signal F becomes the low level. The output of the AND gate 148 is fixed to the low level until the RESETB is deactivated. Because the two inputs of the OR gate 150 become the low levels, its output also becomes the low level, by which the select signal H output from the second decoder 124 becomes the low level (the minimum value), and the peripheral circuit voltage VPER is set to the lowest value V0.

The output of the NAND gate 146 is fixed to the high level until the RESETB is deactivated. Therefore, the select signal G output from the first decoder 122 becomes the high level (the maximum value), and the N-well bias voltage VNWELL is set to the highest value Vm. When the N-well bias voltage VNWELL is set to the highest value Vm, the P-well bias voltage VPWELL is set to the lowest value V0.

In the first period right after the power is turned on, the peripheral circuit voltage VPER is set to the lowest value V0. By fixing the peripheral circuit voltage VPER to a predetermined value of "the lowest value V0", the operations of the fuse circuit 106 and the like become stabilized. Furthermore, by setting the peripheral circuit voltage VPER at the time of rise to the lowest value V0, the power consumption can be suppressed. In addition, because the N-well bias voltage VNWELL and the P-well bias voltage VPWELL are set to the highest value Vm and the lowest value V0, respectively, it is possible to reduce the off-state leak currents of transistor groups formed in wells of the semiconductor memory device 10.

(2) Second Period

Upon the external voltage VDD reaching a predetermined level, the power-on detecting circuit 102 inverts the power-on detection signal VPON to the low level. This means that the external voltage VDD has reached a sufficient level, so that the circuits of the semiconductor memory device 10 can be operated in a stable manner.

Upon the power-on detection signal VPON being changed from the high level to the low level, the one-shot pulse circuit 126 generates a low level pulse (signal A, LOADS). Upon being triggered by this low level pulse, the AF latch circuit 108 starts latching the AF values from the fuse circuit 106. The second period is a period for the AF latch circuit 108 to latch the AF values from the fuse circuit 106. In the case of reading out the AF values from the antifuse elements, for example, it is assumed to take a time about 100 microseconds.

In response to the low level pulse of the signal A, the signal C output from the XOR gate 130 becomes a high level pulse, and the signal D output from the XNOR gate 132 becomes a low level pulse. Because the signal C passes through the third delay circuit 140, the low level pulse of the signal C does not immediately affect the output of the NOR gate 142. However, the NOR gate 142 changes its output, the signal E, from the low level to the high level in response to a change of the power-on detection signal VPON.

Because the SR flip-flop 144 is set by the signal D of the low level and the signal E of the high level, its output, the signal F, becomes the high level. Therefore, the output of the OR gate 150 also becomes the high level, and the second decoder 124 sets the peripheral circuit voltage VPER to the highest value Vm.

In the second period, the maximum peripheral circuit voltage VPER is supplied to the fuse circuit 106 and the AF latch circuit 108. Therefore, the AF latch circuit 108 can read out the AF values from the fuse circuit 106 in a stable manner.

Although the signal D is returned to the high level in a short time, the signal E is maintained to the high level for a while by the third delay circuit 140. Therefore, the signal F, which is the output of the SR flip-flop 144 is also maintained to the high level for a while.

(3) Third Period

When the high level pulse of the signal C that is generated by being triggered by the rise of the power-on detection signal VPON passes through the third delay circuit 140 and reaches the NOR gate 142, the signal E output from the third delay circuit 140 becomes the low level. Upon the signal E becoming the low level, the SR flip-flop 144 is reset, and its output, the signal F, becomes the low level. Because the RESETB is maintained to the activated state (a low level), both of the inputs of the OR gate 150 become the low levels. Therefore, the second decoder 124 resets the peripheral circuit voltage VPER to the lowest value V0. However, the signal E is returned to the high level in a short time. It is because the signal E responds to the high level pulse of the signal C at the start of the second period. Therefore, when the pulse passes through, the signal E is returned to the high level.

Because the peripheral circuit voltage VPER is returned to the lowest value V0, the power consumption is suppressed during the third period. It is required for the AF latch circuit 108 to complete the read out of the AF values within the second period in which the peripheral circuit voltage VPER is set to the highest value Vm. Therefore, it is preferable to set the delay time of the third delay circuit 140 in such a manner that the length of the second period is longer than a time required for the AF latch circuit 108 to latch the AF values.

In conclusion, by setting the peripheral circuit voltage VPER to the lowest value V0 in the first period, it is possible to stabilize rises of the fuse circuit 106, the AF latch circuit 108 and the like while suppressing the power consumption.

When the external voltage VDD then reaches the sufficient level and the power supply to the semiconductor memory device 10 is stabilized, the second period starts. By setting the peripheral circuit voltage VPER to the highest value Vm in the second period, the AF latch circuit 108 reads out the AF values in a stable manner. After an elapse of a predetermined time for the latch, the third period starts. By returning the peripheral circuit voltage VPER to the lowest value V0 in the third period, the semiconductor memory device 10 waits an input of the RESETB while suppressing the power consumption.

(4) Fourth Period

The fourth period is a period for setting the N-well bias voltage VNWELL and the P-well bias voltage VPWELL to the AF values (optimum values). Deactivation of the RESETB to the high level opens the NAND gate 146 and the AND gate 148. When the RESETB is changed from the low level to the high level, the one-shot pulse circuit 128 generates a low level pulse (the signal B). In response to the low level pulse of the signal B, the signal C output from the XOR gate 130 becomes the high level pulse, and the signal D output from the XNOR gate 132 becomes the low level pulse. Because the third delay circuit 140 exists ahead of the signal C, the output of the NOR gate 142 is not immediately affected by a change of the signal C. Therefore, the output of the NOR gate 142 is maintained to the high level for a while.

Because the SR flip-flop 144 is set by the signal D of the low level and the signal E of the high level, its output, the signal F, becomes the high level. Therefore, the output of the OR gate 150 also becomes the high level, and the second decoder 124 sets the peripheral circuit voltage VPER to the highest value Vm.

Although the signal D is returned to the high level in a short time, the signal E is maintained to the high level for a while by the third delay circuit 140. Therefore, the signal F, which is the output of the SR flip-flop 144 is also maintained to the high level for a while.

As the RESETB has become the high level, the AF value (for setting the N-well bias voltage VNWELL) is sent from the NAND gate 146 to the first decoder 122. With this operation, the first decoder 122 sets the N-well bias voltage VNWELL to the AF value. The same goes for the P-well bias voltage VPWELL.

(5) Fifth Period

Upon the high level pulse of the signal C passing through the third delay circuit 140 and reaching the NOR gate 142, the signal E output from the NOR gate 142 becomes the low level. The SR flip-flop 144 is then reset, and its output, the signal F, becomes the low level. Because the RESETB is the high level, the AND gate 148 is open. Because the signal F is the low level, the output of the AND gate 148, that is, the AF value (for setting the peripheral circuit voltage VPER) is input to the second decoder 124 as it is. Therefore, the second decoder 124 sets the peripheral circuit voltage VPER to the AF value.

In conclusion, N-well bias voltage VNWELL and the P-well bias voltage VPWELL are set to the optimum values in the fourth period, and the peripheral circuit voltage VPER is set to the optimum value in the fifth period.

Figure 4:
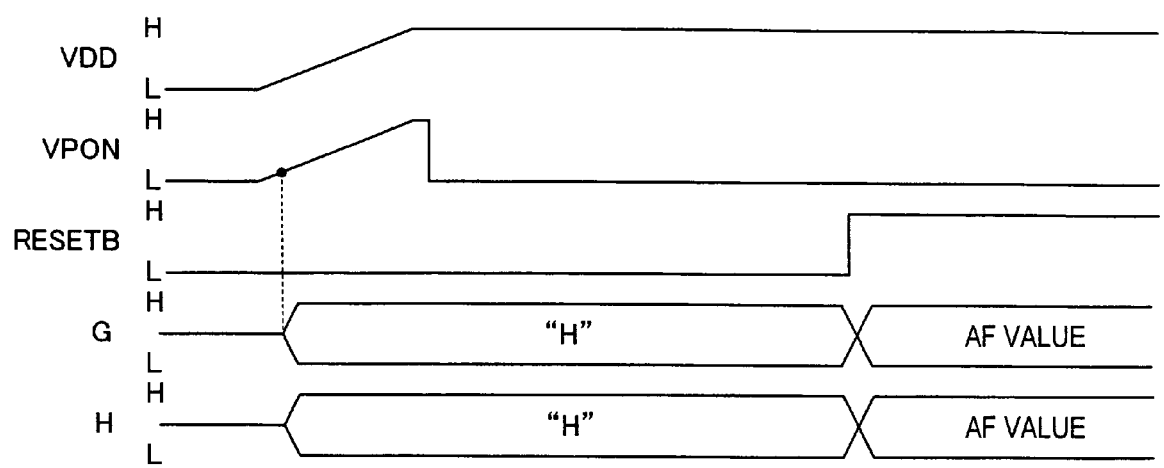
FIG. 4 is a timing chart showing an operation of the internal voltage adjusting circuit after power-on activation as a first modification of the present embodiment.

FIG. 4 is a timing chart showing an operation of the internal voltage adjusting circuit 100 after power-on activation as a first modification of the present embodiment. In the present embodiment, the peripheral circuit voltage VPER is sequentially changed to the lowest value V0, the highest value Vm, and the lowest value V0 in the first period to the third period. However, the peripheral circuit voltage VPER can be fixed to the highest value Vm through the first period to the third period. Although the power consumption can possibly increase compared to the present embodiment, there is an advantage that the process can be simplified. Alternatively, the peripheral circuit voltage VPER can be set to the lowest value V0 in the first period and to the highest value Vm through the second period and the third period.

Figure 5:
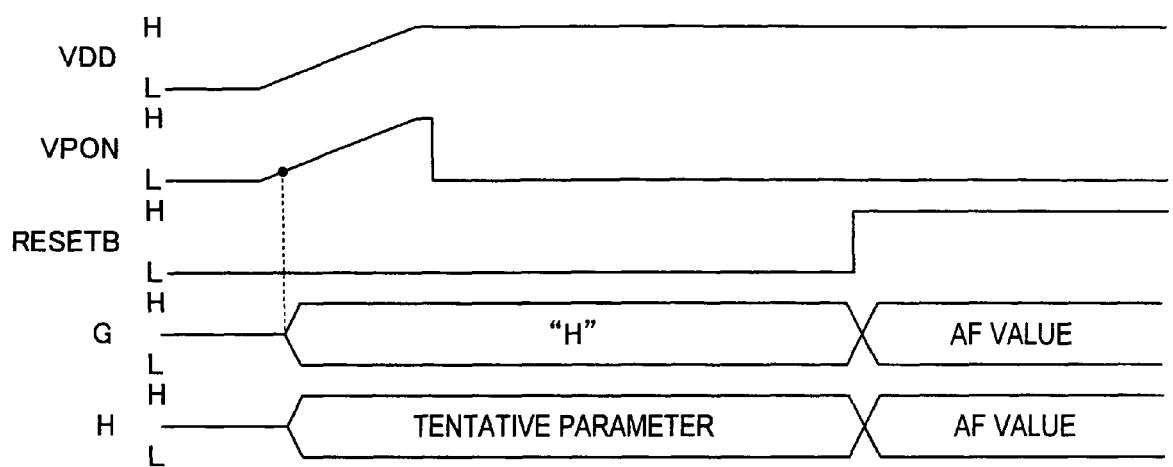
FIG. 5 is a timing chart showing an operation of the internal voltage adjusting circuit 100 after power-on activation as a second modification of the present embodiment.

FIG. 5 is a timing chart showing an operation of the internal voltage adjusting circuit 100 after power-on activation as a second modification of the present embodiment. According to the second modification, the peripheral circuit voltage VPER can be set to a tentative parameter Vx. The tentative parameter Vx is a voltage value determined in advance as a sufficient voltage value for operating the fuse circuit 106 and the AF latch circuit 108.

The semiconductor memory device 10 has been explained above while focusing on a circuit configuration of the internal voltage adjusting circuit 100. With the internal voltage adjusting circuit 100, it is possible to operate a control target circuit in a stable manner with a predetermined value when the voltage is unstable at the time of activation and to operate the circuit in an optimum manner with a device specific value after the voltage is stabilized. Furthermore, by setting the peripheral circuit voltage VPER low in the first period and the third period, it is possible to suppress the power consumption in an effective manner. In addition, by setting the peripheral circuit voltage VPER high in the second period, it is possible to latch the AF values in a stable and easy manner.

While the present invention has been explained above based on embodiment, it will readily occur to those skilled in the art that the above embodiment are only exemplary, various other changes and modifications can be made within the scope of the appended claims of the present invention, and those changes and modifications are also within the scope of the claims. Accordingly, it should be understood that the descriptions and drawings of the present specification are intended as illustrative of the invention, and not as limitative.

In the above embodiment, the fourth period starts by being triggered by deactivation of the RESETB. However, the signal that functions as the trigger is not limited to the RESETB. Therefore, the fourth period can start by being triggered by activation or deactivation of a predetermined signal that is delayed by a sufficient time from an input of the power-on detection signal VPON. In the following explanations, the signal that functions as the trigger for the fourth period, such as the RESETB, is referred to as "set signal". A configuration can be taken such that the power-on detection signal VPON is connected to a delay circuit and a signal that is input with a delay of a predetermined time from an input of the power-on detection signal VPON is used as the set signal. Alternatively, a timer circuit can be used, which outputs the set signal in a predetermined time after the power-on detection signal VPON is input.

The RESETB is a signal that is the low level at the time when the power is turned on, and becomes the high level after an elapse of a predetermined time. Furthermore, the RESETB is changed from the high level to the low level when the operation mode makes a transition from a normal operation mode to a power down mode and from the low level to the high level when the operation mode makes a transition from the power down mode to the normal operation mode. Re-reading of the AF values can be required at the time of returning to the normal operation mode. The present invention can be also applied to re-reading of the AF values at the time of returning to the normal operation mode.

The application target of the present invention is not limited to a DRAM, and the invention can be also applied to other types of semiconductor memory devices such as an SRAM and a flash memory. The present invention can be further applied to logic system semiconductor devices such as an MPU and a DSP (Digital Signal Processor).

In the above embodiment, the fuse circuit 106 has been explained to store the information using the antifuse element. However, the fuse circuit 106 can also store the information using the fuse element instead of the antifuse element. The fuse element causes a change of state from a conductive state to an insulation state by programming, while the antifuse element causes a change of state from an insulation state to a conductive state by programming. It has nothing to do with the essence of the invention whether the state is changed from the conductive state to the insulation state or from the insulation state to the conductive state. It can be understood by those skilled in the art that the present invention can be applied to any element having an electrical characteristic that can be at least changed on a permanent basis as a result of programming.

What is claimed is:

1. A semiconductor device comprising:
   a control target circuit that operates based on a parameter;
   a fuse circuit that holds a first value as the parameter;
   a control circuit that supplies the first value to the control target circuit as the parameter during a normal condition,
   wherein the control circuit supplies a second value different from the first value to the control target circuit as the parameter when a power is turned on,
   wherein the control target circuit comprises an internal voltage generating circuit that generates an internal voltage based on the parameter supplied thereto; and
   a latch circuit that holds the first value which is read out from the fuse circuit,
   wherein the control circuit supplies the first value latched in the latch circuit to the control target circuit, and
   wherein the latch circuit operates with the internal voltage as its operation power source.

2. The semiconductor device as claimed in claim 1, wherein:
   the control circuit supplies a third value as the parameter for the control target circuit right after the power is turned on, and then further supplies the second value as the parameter for the control target circuit, and
   the latch circuit reads out the first value from the fuse circuit when the second value is supplied as the parameter for the control target circuit.

3. The semiconductor device as claimed in claim 2, wherein the control circuit supplies the second value to the control target circuit under a condition that a voltage of the power has reached a predetermined value after the power is turned on.

4. The semiconductor device as claimed in claim 2, wherein the control circuit sets a lowest value settable as the first value as the third value.

5. The semiconductor device as claimed in claim 2, wherein the control circuit sets a highest value settable as the first value as the second value.

6. The semiconductor device as claimed in claim 2, wherein the control circuit further supplies a fourth value to the control target circuit that is lower than the second value after supplying the second value.

7. The semiconductor device as claimed in claim 6, wherein the control circuit sets a lowest value settable as the first value as the fourth value.

8. The semiconductor device as claimed in claim 6, wherein a time from setting the second value to setting the fourth value is greater than a time required for the latch circuit to read out the first value from the fuse circuit.

9. A semiconductor device comprising:
   a fuse circuit storing data;
   a latch circuit latching the data from the fuse circuit;
   a control circuit receiving the data latched by the latch circuit, the control circuit adjusting a reference voltage regardless of the data latched by the latch circuit during a first period and adjusting the reference voltage based on the data latched by the latch circuit during a second period following the first period;
   an internal voltage generating circuit generating an internal voltage based on the reference voltage and supplying the internal voltage to the latch circuit so that the latch circuit operates on the internal voltage; and
   a power source terminal supplied with an external voltage from outside of the semiconductor device,
   wherein the first period includes a first part from a power-on of the semiconductor device, a second part following the first part, and a third part following the second part, and wherein the control circuit adjusts the reference voltage in the first part of the first period so that the reference voltage becomes a first level, adjusts the reference voltage in the second part of the first period so that the reference voltage becomes a second level greater than the first level and adjusts the reference voltage in the third part of the first period so that the reference voltage becomes the first level.

10. A semiconductor device comprising:
    a fuse circuit storing data;
    a latch circuit coupled to the fuse circuit and configured to latch the data in response to an active level of a first control signal, the latch circuit thereby producing latched data;
    a gate circuit coupled to the latch circuit to receive the latched data, the gate circuit being further coupled to receive a second control signal, the gate circuit being configured to produce first output data that is irrelevant to the latched data when the second control signal takes a first logic level and second output data that is relevant to the latched data when the second control signal takes a second logic level;
    a power source terminal receiving a power supply voltage to be supplied to the semiconductor device; and
    a power-on detecting circuit detecting a level of the power supply voltage and generating the first control signal, the first control signal taking the active level when the level of the power supply voltage reaches a predetermined level.

11. The semiconductor device as claimed in claim 10, further comprising a terminal receiving a reset signal from outside of the semiconductor device, the reset signal being supplied to the gate circuit as the second control signal.

12. The semiconductor device as claimed in claim 11, wherein the reset signal is maintained at an activation level during a predetermined period of time after the first control signal is changed from the active level to an inactive level and then shifted to an inactivation level, the activation and inactivation levels of the reset signal bringing the second control signal to the first and second logic levels, respectively.

13. The semiconductor device as claimed in claim 10, wherein the first control signal is generated as a one-shot pulse signal having a pulse width defined by the active level.

14. The semiconductor device as claimed in claim 13, further comprising a terminal receiving a reset signal from an outside of the semiconductor device, the reset signal being supplied to the gate circuit as the second control signal, the reset signal being maintained at an activation level during a predetermined period of time after the first control signal is changed from the active level to an inactive level and then shifted to an inactivation level, the activation and inactivation levels of the reset signal bringing the second control signal to the first and second logic levels, respectively.

15. The semiconductor device as claimed in claim 14, further comprising an internal voltage generating circuit generating a first internal voltage in response to the first output data and a second internal voltage in response to the second output data.

16. The semiconductor device as claimed in claim 15, wherein the latch circuit is coupled to the internal voltage generating circuit to operate on one of the first and second internal voltages.

* * * * *